United States Patent
Helberg et al.

(10) Patent No.: US 9,438,071 B1
(45) Date of Patent: Sep. 6, 2016

(54) ADVANCED CONVECTIVELY-COOLED INDUCTIVE CHARGING

(71) Applicant: DELL PRODUCTS, L.P., Round Rock, TX (US)

(72) Inventors: Chris Helberg, Austin, TX (US); Travis C. North, Cedar Park, TX (US); Andrew Sultenfuss, Leander, TX (US); Austin M Shelnutt, Leander, TX (US)

(73) Assignee: DELL PRODUCTS, L.P., Round Rock, TX (US)

( * ) Notice: Subject to any disclaimer, the term of this patent is extended or adjusted under 35 U.S.C. 154(b) by 16 days.

(21) Appl. No.: 14/632,727

(22) Filed: Feb. 26, 2015

(51) Int. Cl.
| | |
|---|---|
| *H02J 7/00* | (2006.01) |
| *H02J 7/02* | (2016.01) |
| *H05K 7/20* | (2006.01) |
| *H02J 7/04* | (2006.01) |
| *H02J 5/00* | (2016.01) |
| *H01F 27/36* | (2006.01) |

(52) U.S. Cl.
CPC ............. *H02J 7/025* (2013.01); *H01F 27/365* (2013.01); *H02J 5/005* (2013.01); *H02J 7/04* (2013.01); *H05K 7/2039* (2013.01)

(58) Field of Classification Search
CPC .......... H02J 7/025; H02J 50/10; H02J 50/12; H02J 50/70; H02J 50/80; H02J 50/90; H01F 27/10; H01F 27/085; H01F 27/288; H01F 27/2885; H01F 27/346; H01F 27/365
USPC ..... 320/108; 336/55, 57, 58, 84 R, 84 M, 94
See application file for complete search history.

(56) References Cited

U.S. PATENT DOCUMENTS

| | | | |
|---|---|---|---|
| 7,307,841 B2 | 12/2007 | Berlin et al. | |
| 7,633,753 B2 | 12/2009 | Sauciuc et al. | |
| 8,604,899 B2* | 12/2013 | Galletti | H01F 27/085 336/179 |
| 2005/0189910 A1* | 9/2005 | Hui | H01F 17/0006 320/108 |
| 2013/0005251 A1* | 1/2013 | Soar | B60N 2/4876 455/41.1 |
| 2013/0165993 A1* | 6/2013 | Aghassian | A61N 1/36125 607/59 |
| 2014/0191717 A1* | 7/2014 | Hong | H02J 5/005 320/108 |
| 2015/0102685 A1* | 4/2015 | Blood | H02J 5/005 307/104 |
| 2015/0115880 A1* | 4/2015 | Soar | F41G 11/00 320/108 |
| 2015/0381239 A1* | 12/2015 | Shostak | H04B 5/0037 455/41.1 |

* cited by examiner

*Primary Examiner* — Richard Isla Rodas
*Assistant Examiner* — Michael DiBenedetto
(74) *Attorney, Agent, or Firm* — Isidore PLLC

(57) ABSTRACT

An information handling system (IHS) includes a base station that has a transmitter coil to generate a magnetic field for charging a portable power source of a battery-powered electronic device. A receiver coil magnetically receives power from the transmitter coil of the base station. A power control module connected to the portable power source and the receiver coil charges the portable power source with the received power. A flexible ferrite shield is positioned on a side of the receiver coil opposite to the transmitter coil to shield the IHS electronics. A pneumatic diaphragm is formed by a portion of the flexible ferrite shield that is positioned for oscillating movement into a center cavity of the receiver coil. A diaphragm actuator is attached to the pneumatic diagram and is responsive to a triggering signal to oscillate the pneumatic diaphragm to disperse thermal energy that is generated by the receiver coil.

20 Claims, 5 Drawing Sheets

ADVANCED CONVECTIVELY-COOLED INDUCTIVE CHARGING

BACKGROUND

1. Technical Field

This disclosure generally relates to thermal cooling of information handling systems (IHSs), and more particular to cooling a magnetic receiver coil in a wirelessly rechargeable battery-powered IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Some IHSs, such as mobile devices, power their electronic components with a portable power source such as batteries. Increasingly, wireless power transfer is being utilized to charge the batteries of mobile devices to avoid the inconvenience and wear out of electrical cables and connectors. However, several competing design goals for wireless charging of mobile devices can create challenges. Generally, thinner mobile devices are preferred that provide little structure or space for cooling devices. Generally also, outer housings of mobile devices have a minimum of openings to prevent water and contaminants from damaging internal electronic components. However, the lack of air exchange can reduce cooling. In addition, users prefer that the time required to recharge their mobile device be at a minimum. Although wireless energy transfer can be performed at a relatively good efficiency rate, a receiver coil for wireless energy transfer in the mobile device will experience heating, especially at higher energy transfer rates. The receiving coil can be near to heat-sensitive components such as a battery that can be damaged by excessive heat. Thinner structures that support or enclose the receiver coil are incapable of sinking the excessive heat to mitigate such damage. Alternatively, for aesthetic, economy or other reasons, these structures may alternatively be formed from materials such as polymers or resins that are not good thermal conductors. Therefore, increased thermal cooling is needed for higher levels of wireless charging of a mobile device that does not impact other design features.

BRIEF SUMMARY

The illustrative embodiments of the present disclosure provide a flexible ferrite sheet that (i) protects electronic components in a mobile device, (ii) increases efficiency of magnetic energy transfer, and (iii) aids in cooling a receiver coil used for energy transfer. In particular, the flexible ferrite sheet acts as a pneumatic diaphragm in the center of the receiving coil of a wireless energy transfer arrangement to dissipate thermal energy. Thereby, a thinner structure can be achieved for the mobile device by designing and/or utilizing a structure required for efficient energy transfer to perform an additional function of cooling.

According to at least one aspect of the present disclosure, an information handling system (IHS) includes IHS electronics that are powered by a portable power source. A receiver coil magnetically receives power from a transmitter coil that is located within a proximate range of the receiver coil. A power control module connected to the portable power source and to the receiver coil charges the portable power source with received power from the receiver coil. A flexible ferrite shield is positioned on a side of the receiver coil opposite to a location of the transmitter coil to shield the IHS electronics. A pneumatic diaphragm is formed by a portion of the flexible ferrite shield and is positioned for oscillating movement into a center cavity of the receiver coil. A diaphragm actuator attached to the pneumatic diaphragm responds to a triggering signal to oscillate the pneumatic diaphragm to disperse thermal energy that is generated by the receiver coil.

According to at least one aspect of the present disclosure, an IHS includes a base station that has a transmitter coil to generate a magnetic field for charging a portable power source of a Wirelessly Rechargeable Battery-Powered (WRBP) device. IHS electronics of the WRBP device are powered by the portable power source. A receiver coil located within the WRBP device magnetically receives power from the transmitter coil of the base station. A power control module connected to the portable power source and to the receiver coil charges the portable power source with the received power. A flexible ferrite shield is positioned on a side of the receiver coil opposite to the transmitter coil to shield the IHS electronics. A pneumatic diaphragm is formed by a portion of the flexible ferrite shield and is positioned for oscillating movement into a center cavity of the receiver coil. A diaphragm actuator is attached to the pneumatic diagram and is responsive to a triggering signal to oscillate the pneumatic diaphragm to disperse thermal energy that is generated by the receiver coil.

According to at least one aspect of the present disclosure, a method is provided of dispersing heat generated by wireless energy transfer for powering an IHS. In one embodiment, the method includes a receiver coil, located inside of the IHS, receiving a magnetic field from an external transmitter coil. The receiver coil is shielded on a side opposite to the transmitter coil by a flexible ferrite shield having a portion that forms a pneumatic diaphragm positioned for oscillating movement into a center cavity of the receiver coil. The method includes charging a portable power source with the received power from the receiver coil to power IHS equipment. The method includes triggering a diaphragm actuator that is attached to the pneumatic diaphragm to oscillate the pneumatic diaphragm to disperse thermal energy that is generated by the receiver coil.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
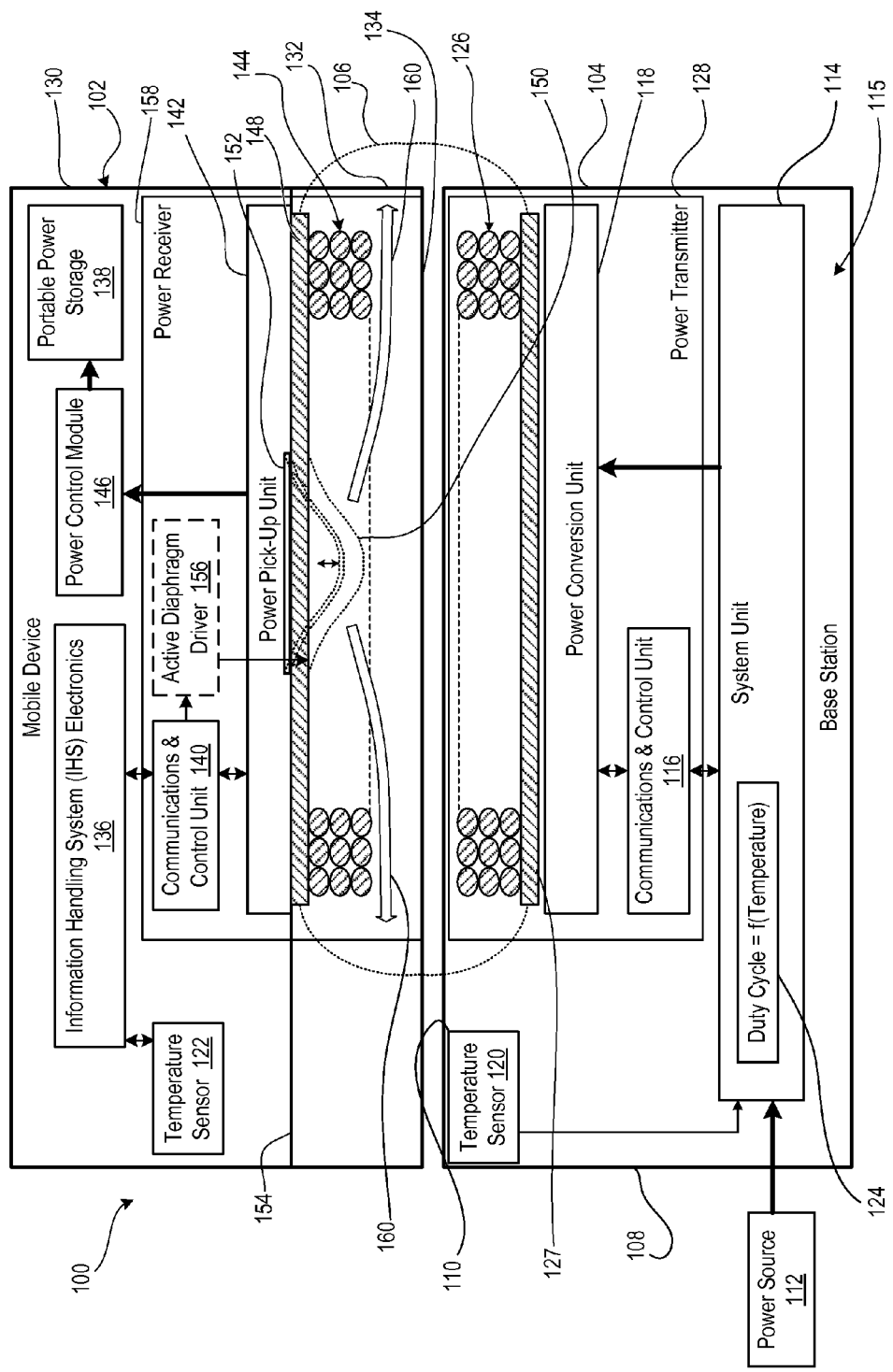
FIG. 1 illustrates a diagrammatic view of an information handling system (IHS) having a Wirelessly Rechargeable Battery-Powered (WRBP) device that is placed on a base station for magnetic energy transfer, according to one or more embodiments.

An information handling system (IHS) includes a base station that has a transmitter coil to generate a magnetic field for charging a portable power source of a Wirelessly Rechargeable Battery-Powered (WRBP) device such as a mobile device or implanted device. The magnetic field can be magnetic energy transfer by Magnetic Induction (MI) or Magnetic Resonance (MR). A receiver coil within the WRBP device magnetically receives power from the transmitter coil of the base station. A power control module connected to the portable power source and the receiver coil charges the portable power source with the received power. A flexible ferrite shield is positioned on a side of the receiver coil opposite to the transmitter coil to shield the IHS electronics. A pneumatic diaphragm is formed by a portion of the flexible ferrite shield and is positioned for oscillating movement into a center cavity of the receiver coil. A diaphragm actuator is attached to the pneumatic diagram and is responsive to a triggering signal to oscillate the pneumatic diaphragm to disperse thermal energy that is generated by the receiver coil. The triggering signal can be the magnetic field that directly causes a diaphragm actuator containing magnetic material to move. The triggering signal can also be active components of the WRBP device that electrically actuate a diaphragm actuator, such a piezoelectric or electromechanical actuator.

Current transport through wireless power transmit and receive coils create thermal challenges due to Joule heating ($P=I^2R$) with typical loss ranges between 20 to 40% and power delivery ranges from 5 to 20 W. Coil placement is typically physically located in constrained locations with regard to cooling with depth (Z) limitations between 1 to 3 mm. For example, location dependencies of certain internal components of the WRBP device can require coil placement (a) on top of the battery creating localized hot spots that degrade battery life or (b) below display panels that similarly generate hot spots, reducing panel image quality. Coil placement can also be near to areas that users commonly touch causing discomfort. Mutual heating by other active components of the WRBP device can also be a factor, such as proximity to processors and Wireless Wide Area Network (WWAN) and Wireless Local Area Network (WLAN) transmission components. The pneumatic diaphragm introduced by the present disclosure can achieve localized air velocities in the receiver coil region of up to 5 m/s that can increase of local heat transfer coefficient by ten (10) times. Therefore, pneumatic diaphragm provides increased thermal cooling that does not increase the thickness of a WRBP device such as a mobile device.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a block diagram representation of an example IHS 100 that includes wirelessly rechargeable battery-powered (WRBP) devices such as a mobile device 102 that is placed in proximity to a base station 104 for wireless energy transfer by a magnetic field 106. Other examples of WRBP devices can include implanted devices that are not accessible by a physical power connection. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

In one embodiment, the base station 104 includes a base housing 108 that presents an interface surface 110 on which the mobile device 102 can be placed. A power source 112 such as an electrical outlet supplies electrical power to a system unit 114 of the base station 104 that powers its internal components 115 as well as powers the magnetic energy transfer to the mobile device 102. The system unit 114 directs a communications and control unit 116 that controls a power conversion unit 118. The power conversion unit 118 modulates power through the transmitter coil 126 for the magnetic field 106 to have the electromagnetic characteristics as directed by the communications and control unit 116. In one embodiment, the system unit 114 can receive a sensed temperature from an internal temperature sensor 120 of the base station 104 that can prompt a change in the directed electromagnetic characteristics of the magnetic field 106. The system unit 114 can also receive a sensed temperature from an external temperature sensor 122, such as communicated from the mobile device 102. The system unit 114 can respond to the sensed temperature by setting a parameter in a control algorithm 124 that controls duty cycle as a function of temperature. Changing the duty cycle can reduce the amount of energy loss at the mobile device 102 or change a rate of cooling by the mobile device 102. The system unit 114 also provides electrical power to the power conversion unit 118. The power conversion unit 118 modulates the electrical power through a primary or transmitter coil 126 to create the magnetic field 106. On an opposite side of the transmitter coil 126, a ferrite shield 127 protects the internal components 115 from the magnetic field 106. The communication and control unit 116, power conversion unit 118, and transmitter coil 126, and ferrite shield 127 form a power transmitter 128.

In one embodiment, the mobile device 102 includes a mobile housing 130 that includes a back cover 132. A skin 134 of the back cover 132 is presented to the interface surface 110 of the base station 104 for support and to sink thermal energy. In one embodiment the skin 134 is formed from plastic, although other materials such as metal may be used. The mobile device 102 includes IHS electronics 136 that are powered by portable power storage 138. The IHS electronics 136 can be in communication with the external temperature sensor 122 for actively controlling activities that generate or dissipate thermal energy. The IHS electronics 136 can also perform communication including communicating sensed temperature to the base station 104. The IHS electronics 136 can direct a communications and control unit 140, which controls a power pick-up unit 142 that electrically manages power reception by a secondary or receiver coil 144. Received power from the power pick-up unit 142 is delivered to a power control module 146, which charges the portable power storage 138.

On a side opposite to the base station 104, the receiver coil 144 is shielded by a flexible ferrite (absorber) sheet 148. Examples of flexible ferrite absorber sheets include Models WE-FAS and WE-FSFS by Würth Elektronik GmbH & Co. KG (http://katalog.we-online.de). The transmitter coil 126 and receiver coil 144 form a coreless resonant transformer. The ferrite shield 127 and flexible ferrite sheet 148 ensure that magnetic energy transfer occurs with an acceptable efficiency as well as protects other components. In addition to providing such magnetic efficiency, the flexible ferrite sheet 148 also includes a central portion that forms a pneumatic diaphragm 150 for increasing heat dissipation.

In one embodiment, the pneumatic diaphragm 150 of the flexible ferrite sheet 148 incorporates a magnetic responsive structure to act as a diaphragm actuator 152 that responds to the magnetic field 106. Alternatively, the diaphragm actuator 152 can be a piezoelectric actuator or an electromechanical actuator that actuates between a nonferrous frame 154 such as aluminum and the pneumatic diaphragm 150 of the flexible ferrite sheet 148 in response to an electrical signal from an active diaphragm driver 156 that is in communication with the communications and control unit 140 as part of a power receiver 158.

As the pneumatic diaphragm 150 is flexed (convex) the air is displaced as outward air movement 160 in the region of the receiver coil 144. A pressure gradient is developed pushing air out and over the receiver coil 144 and skin 134 of the back cover 132. A larger surface area of the back cover 132 can externally dissipate the thermal energy as skin 134 and surface of the receiver coil 144 are cooled by the air movement 160.

Figure 2:
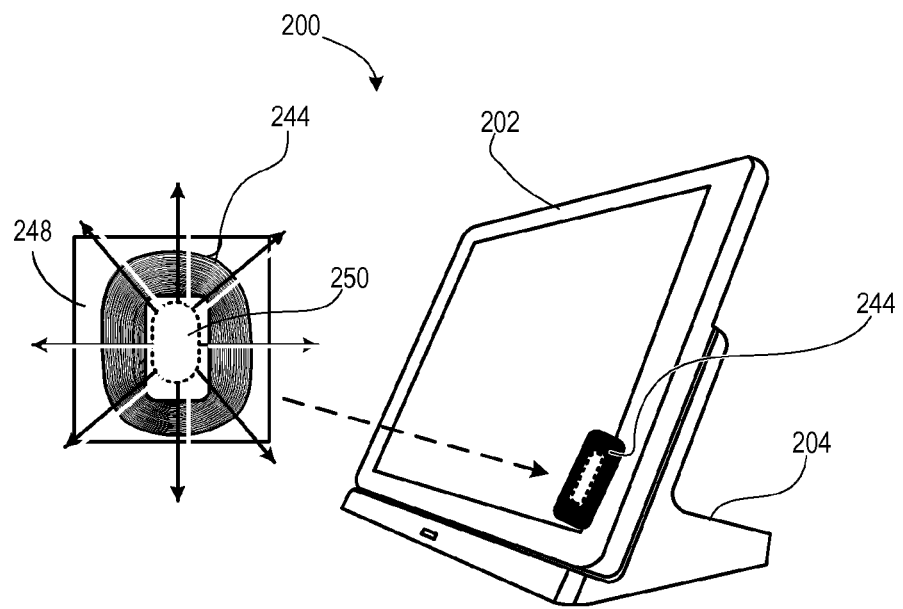
FIG. 2 illustrates a perspective view of an example IHS of FIG. 1 with a detail view of a receiver coil of the mobile device that includes a pneumatic diaphragm for thermal energy dissipation, according to one or more embodiments.
Figure 3:
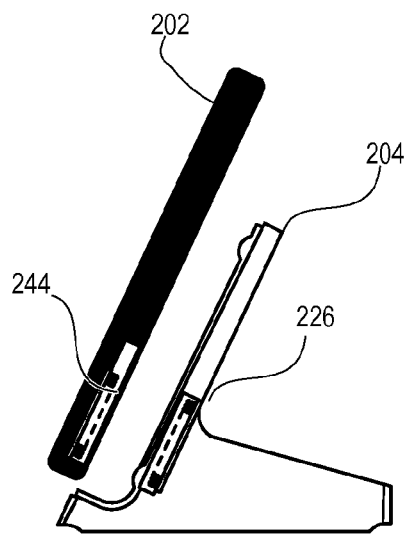
FIG. 3 illustrates a side view of the IHS of FIG. 2 with the mobile device disengaged from the base station, according to one or more embodiments.

FIGS. 2-3 illustrate an example IHS 200 with a receiver coil 244 of a mobile device 202 that includes a pneumatic diaphragm 250 formed from a flexible ferrite sheet 248 for thermal energy dissipation, according to one or more embodiments. FIG. 2 illustrates the mobile device 202 docked in a base station 204 for wireless energy transfer. FIG. 3 illustrates the mobile device 202 of the IHS 200 disengaged from the base station 204. The base station 204 has a transceiver coil 226.

For clarity, FIGS. 1-3 illustrate the mobile device 102 docked on the base station 104 placing a receiver coil 244 in close proximity of the base station 104, 204 as is generally required for efficient energy transfer by Magnetic Induction (MI). However, aspects of the present innovation can be applied to energy transfer by Magnetic Resonance (MR) as well. Generally, the receiver coil is unshielded for MR energy transfer so that the orientation to the transmitter coil is not constrained. An embodiment consistent with aspects of the present innovation can still provide for consistently placing a mobile device such that the flexible ferrite shield does not block the MR energy transfer.

The magnetic energy transfer can conform to an industry standard for MI or MR. Magnetic Induction technology (Qi and PMA) was first to market and dominates in the nascent wireless power market. However Magnetic Resonance (A4WP) has some real advantages over MI, along with additional challenges. The A4WP fixed higher operating frequency of 6.78 MHz compared to Qi's 110 to 205-kHz operating range allows more efficient power transfer at looser coupling factors (more positional flexibility), apparent through Faraday's law of inductance. The higher frequencies and higher coil voltages also allow smaller and thinner receive coils, making the mechanical fit into mobile devices easier. Another benefit of the higher operating frequency is lower heat buildup in metallic foreign objects in proximity of the transmit pad due to lower surface eddy currents. This also means parasitic metals in the device under charge (like the battery) are less likely to accumulate heat.

The A4WP standard uses bidirectional Bluetooth Low Energy (BLE) out-of-band signaling to communicate and regulate the power needs of device(s) under charge. In contrast, Qi and PMA use a unidirectional in-band communication method of load modulation to communicate power regulation information back to the transmitter. The Qi method is simple and inexpensive, but can only handle one receiver, is limited to a low communications rate, and can be susceptible to system generated electromagnetic interference (EMI). The MR receiver uses an inductor-capacitor (LC) tank circuit with a high Q factor operating directly at the resonance frequency. The challenge is keeping the tank circuit tuned to a fixed resonant frequency over temperature and voltage. When the transmitted frequency drifts, efficiency drops off. MI standards are simpler to implement because they always operate above the resonant frequency and therefore do not require a high Q circuit or precise passive components. However, the cost of higher-tolerance components for MR's high-Q circuit is offset by a lower coil cost. The unshielded MR receive coil is also smaller and uses thinner wire than the MI coil, and therefore the cost should be less for that critical component. Mechanically, MI is a closely coupled system meaning the transmit and receive coils are placed directly on top of each other enabling MI power transfer, and it is this arrangement that allows ferrite shielding to be employed directly above and below the coils.

Figure 4:
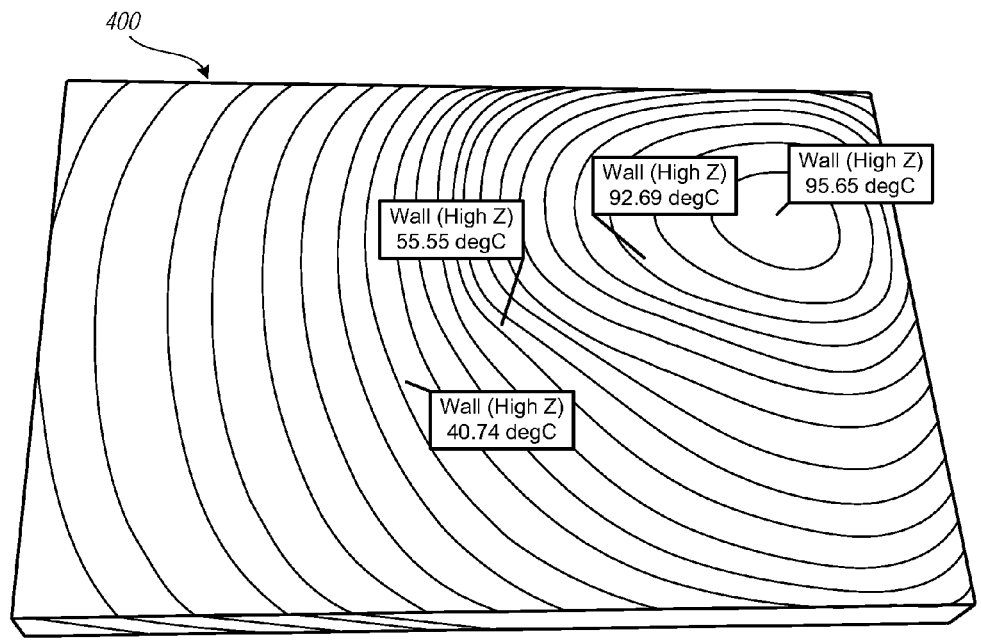
FIG. 4 illustrates a graphical representation of computational fluid dynamic (CFD) thermal analysis of a plastic skin of a baseline mobile device, according to one or more embodiments.
Figure 5:
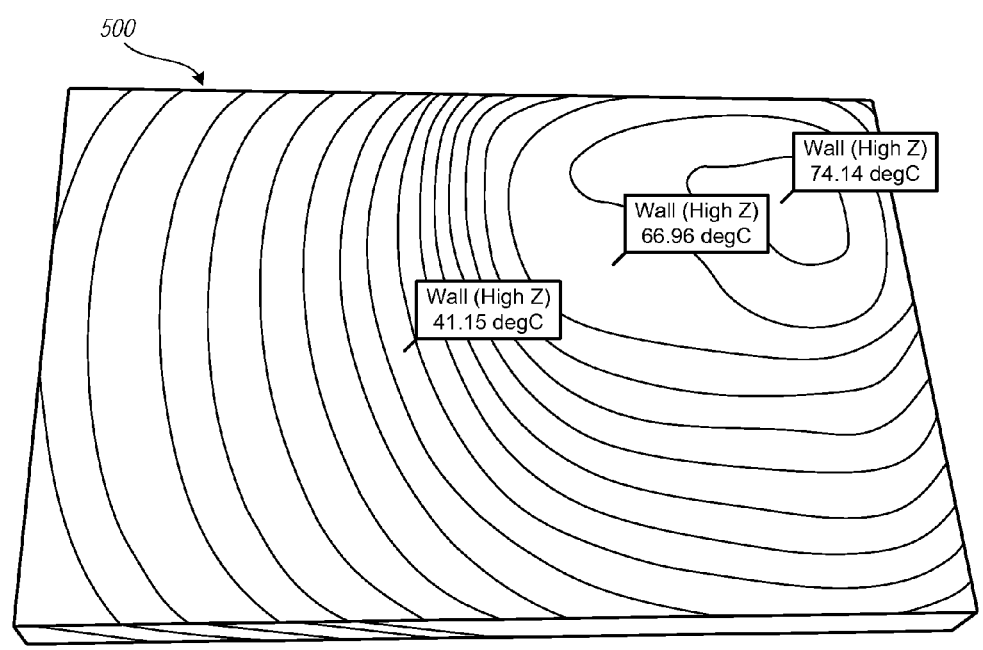
FIG. 5 illustrates a graphical representation of CFD thermal analysis of the plastic skin of an example mobile device that incorporates a pneumatic diaphragm for thermal energy dissipation, according to one or more embodiments.

FIG. 4 illustrates a graphical representation 400 of computational fluid dynamic (CFD) thermal analysis of a plastic chassis of a baseline mobile device with 3 W of charging loss. In particular, the graphical representation 400 illustrates surface temperatures that would achieve best operating capability (BOC) for a 10 W charging solution. Increasing charging to 4 W of inductive loss indicates skin temperatures above 95° C. FIG. 5 illustrates a graphical representation 500 of CFD thermal analysis of the plastic skin of an example mobile device that incorporates a pneumatic diaphragm for thermal energy dissipation, according to one or more embodiments. Utilization of air moving solution at 0.5 cubic feet per minute (CFM) can reduce skin temperature to 74° C., which is a 20° C. reduction over baseline with larger and improved isotherms.

Figure 6:
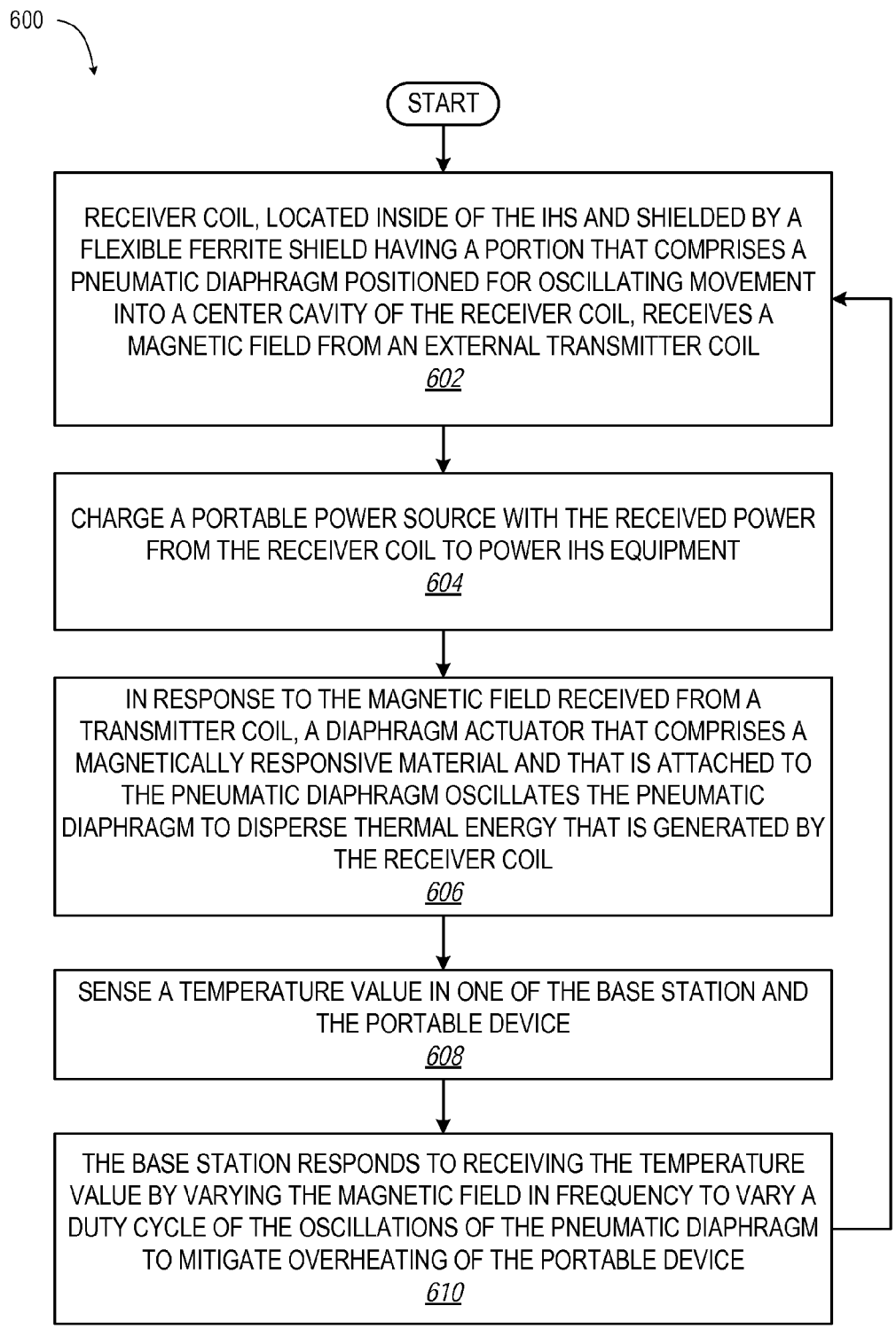
FIG. 6 illustrates a flow diagram of a method of providing wireless energy transfer for powering an IHS that is a mobile device that can dock to a separate base station, according to one or more embodiments.

FIG. 6 illustrates a method 600 of providing wireless energy transfer for powering an IHS that is a mobile device that can dock to a separate base station. In one embodiment, heat generated in a receive coil of a mobile device is passively dissipated by utilizing flexible ferrite shielding, which magnetically responds to the magnetic induction in a frequency range that is conducive to acoustic oscillations. Method 600 begins at start block. Method 600 includes a receiver coil, located inside of the IHS, receiving a magnetic field from an external transmitter coil (block 602). The receiver coil is shielded on a side opposite to the transmitter coil by a flexible ferrite shield having a portion that comprises a pneumatic diaphragm positioned for oscillating movement into a center cavity of the receiver coil. The method 600 includes charging a portable power source with the received power from the receiver coil to power IHS equipment (block 604). The method 600 includes triggering a diaphragm actuator that includes a magnetically responsive material and is attached to the pneumatic diaphragm to oscillate the pneumatic diaphragm in order to disperse thermal energy that is generated by the receiver coil (block 606). The method 600 includes sensing a temperature value in one of the base station and the mobile device (block 608). The mobile device can sense the temperature and communicate the sensed temperature to the base station. Alternatively, the base station can sense the temperature. The base station responds to receiving the temperature value by varying the magnetic field in frequency to vary a duty cycle of the oscillations of the pneumatic diaphragm in order to mitigate overheating of the mobile device (block 610). Then method 600 returns to block 602 to continue dissipating thermal energy during magnetic energy transfer.

Figure 7:
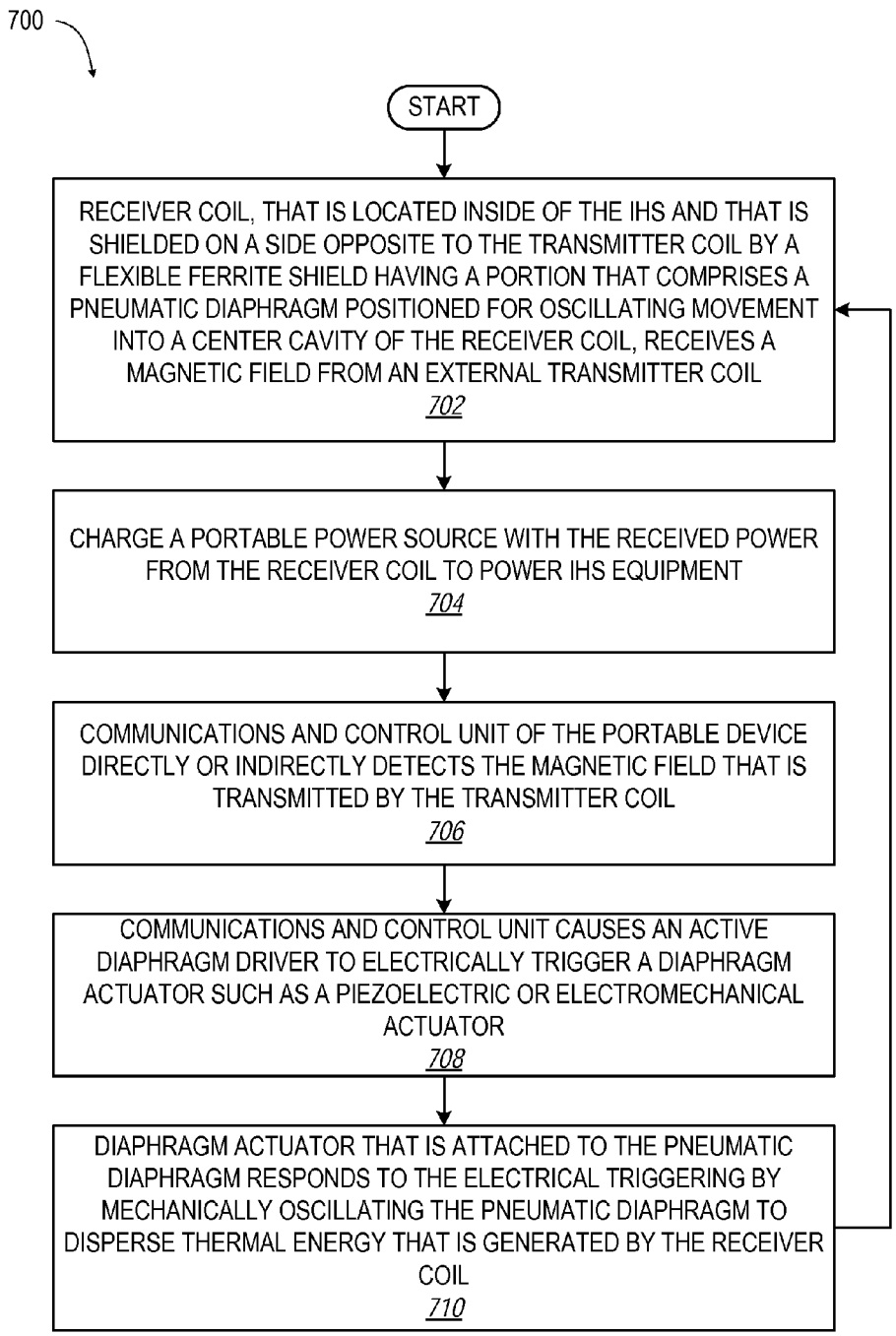
FIG. 7 illustrates a flow diagram of a method of providing wireless energy transfer for powering an IHS that includes a mobile device that actively performs cooling of a magnetic receiver coil, according to one or more embodiments.

FIG. 7 illustrates a method 700 of providing wireless energy transfer for powering an IHS that includes a mobile device that actively performs cooling of a magnetic receiver coil. The method 700 begins at start block. In one embodiment, the method 700 includes a receiver coil, located inside of the IHS, receiving a magnetic field from an external transmitter coil (block 702). The receiver coil is shielded on a side opposite to the transmitter coil by a flexible ferrite shield having a portion that comprises a pneumatic diaphragm positioned for oscillating movement into a center cavity of the receiver coil. The method 700 includes charging a portable power source with the received power from the receiver coil to power IHS equipment (block 704). The method 700 includes a communications and control unit of the mobile device directly or indirectly detecting the magnetic field that is transmitted by the transmitter coil (block 706). The communications and control unit causes an active diaphragm driver to electrically trigger a diaphragm actuator such as a piezoelectric or electromechanical actuator (block 708). The method 700 includes the diaphragm actuator that is attached to the pneumatic diaphragm responding to the electrical triggering by mechanically oscillating the pneumatic diaphragm to disperse thermal energy that is generated by the receiver coil (block 710). Then method 700 returns to block 702 to continue dissipating thermal energy during magnetic energy transfer.

In the above described flow charts of FIGS. 6-7, one or more of the methods may be embodied in an automated controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An information handling system (IHS) comprising:
a portable power source;
IHS electronics that are powered by the portable power source;
a receiver coil to magnetically receive power from a transmitter coil that is located within a proximate range of the receiver coil;
a power control module connected to the portable power source and the receiver coil to charge the portable power source with received power from the receiver coil;
a flexible ferrite shield that is positioned on a side of the receiver coil opposite to a location of the transmitter coil to shield the IHS electronics;
a pneumatic diaphragm comprising a portion of the flexible ferrite shield that is positioned for oscillating movement into a center cavity of the receiver coil; and
a diaphragm actuator attached to the pneumatic diagram and which responds to a triggering signal to oscillate the pneumatic diaphragm to disperse thermal energy that is generated by the receiver coil.

2. The IHS of claim 1, wherein:
the triggering signal is a magnetic field that is transmitted by the transmitter coil; and
the diaphragm actuator comprises a magnetically responsive material to mechanically respond to the magnetic field by oscillating.

3. The IHS of claim 1, further comprising:
a temperature sensor to sense a temperature that is proximate to the receiver coil; and
a communication component electrically connected to the temperature sensor and which receives the sensed temperature, the communication component being in wireless communication with a base station that contains the transmitter coil to communicate feedback that is representative of the sensed temperature to cause the base station to vary a frequency of the magnetic field, which varies a duty cycle of the oscillations of the pneumatic diaphragm.

4. The IHS of claim 1, further comprising a diaphragm driver to generate and to transmit the triggering signal to the diaphragm actuator.

5. The IHS of claim 4, further comprising a temperature sensor to sense a temperature that is proximate to the receiver coil, wherein the diaphragm driver varies a duty cycle of the triggering signal based on a value of the sensed temperature.

6. The IHS of claim 4, wherein the diaphragm driver is enabled by magnetic fields that are transmitted by the transmitter coil.

7. The IHS of claim 1, wherein the diaphragm actuator comprises a piezoelectric actuator.

8. The IHS of claim 1, wherein the diaphragm actuator comprises an electromechanical actuator.

9. An information handling system (IHS) comprising:
a base station comprising:
a transmitter coil to generate an magnetic field; and
a Wirelessly Rechargeable Battery-Powered (WRBP) device comprising:
a portable power source;
an IHS electronics that are powered by the portable power source;
a receiver coil to magnetically receive power from the transmitter coil;

a power control module connected to the portable power source and the receiver coil to charge the portable power source with the received power;

a flexible ferrite shield that is positioned on a side of the receiver coil opposite to the transmitter coil to shield the IHS electronics;

a pneumatic diaphragm comprising a portion of the flexible ferrite shield that is positioned for oscillating movement into a center cavity of the receiver coil; and a diaphragm actuator that is attached to the pneumatic diagram and that is responsive to a triggering signal to oscillate the pneumatic diaphragm to disperse thermal energy that is generated by the receiver coil.

10. The IHS of claim 9, wherein the base station further comprises:

a power conversion unit that controls a frequency of the magnetic field generated by the transmitter coil;

a temperature sensor to sense a temperature value in one of the base station and the WRBP device; and a processor in electrical communication with the temperature sensor to receive the temperature value and in electrical communication with the power conversion unit to vary the magnetic field in frequency to vary a duty cycle of the oscillations of the pneumatic diaphragm of the WRBP device.

11. The IHS of claim 10, wherein the power conversion unit and transmitter coil perform magnetic induction energy transfer.

12. The IHS of claim 10, wherein the power conversion unit and transmitter coil perform magnetic resonance energy transfer.

13. A method of providing wireless energy transfer for powering an information handling system (IHS), the method comprising:

a receiver coil, located inside of the IHS, receiving a magnetic field from an external transmitter coil, wherein the receiver coil is shielded on a side opposite to the transmitter coil by a flexible ferrite shield having a portion that comprises a pneumatic diaphragm positioned for oscillating movement into a center cavity of the receiver coil;

charging a portable power source with the received power from the receiver coil to power IHS equipment; and triggering a diaphragm actuator that is attached to the pneumatic diaphragm to oscillate the pneumatic diaphragm to disperse thermal energy that is generated by the receiver coil.

14. The method of claim 13, wherein:

the diaphragm actuator comprises a magnetically responsive material; and triggering the diaphragm actuator comprises the magnetic field of the transmitter coil mechanically oscillating the diaphragm actuator and the attached pneumatic diaphragm.

15. The method of claim 14, wherein the IHS is a WRBP device that can dock to a separate base station, the method further comprising:

sensing a temperature value in one of the base station and the WRBP device; and varying the magnetic field in frequency to vary a duty cycle of the oscillations of the pneumatic diaphragm.

16. The method of claim 13, wherein triggering the diaphragm actuator comprises:

detecting, by the WRBP device, the magnetic field that is transmitted by the transmitter coil; and electrically actuating the diaphragm actuator in response to detecting the magnetic field.

17. The method of claim 16, wherein triggering the diaphragm actuator comprises electrically actuating a piezoelectric actuator.

18. The method of claim 16, wherein triggering the diaphragm actuator comprises electrically actuating an electromechanical actuator.

19. The method of claim 13, wherein receiving the magnetic field comprises receiving magnetic induction energy transfer.

20. The method of claim 13, wherein receiving the magnetic field comprises receiving magnetic resonance energy transfer.

* * * * *